(12) United States Patent
Chen et al.

(10) Patent No.: US 11,506,985 B2
(45) Date of Patent: Nov. 22, 2022

(54) SEMICONDUCTOR APPARATUS AND METHOD OF OPERATING THE SAME FOR PREVENTING PHOTOMASK PARTICULATE CONTAMINATION

(71) Applicant: TAIWAN SEMICONDUCTOR MANUFACTURING CO., LTD., Hsinchu (TW)

(72) Inventors: Jui-Chieh Chen, Hsinchu (TW); Tsung-Chih Chien, Nantou County (TW); Chih-Tsung Shih, Hsinchu (TW); Tsung-Chuan Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 524 days.

(21) Appl. No.: 16/396,911

(22) Filed: Apr. 29, 2019

(65) Prior Publication Data

US 2020/0341388 A1 Oct. 29, 2020

(51) Int. Cl.
*G03F 7/20* (2006.01)
*G03F 1/66* (2012.01)

(52) U.S. Cl.
CPC ............ *G03F 7/70708* (2013.01); *G03F 1/66* (2013.01); *G03F 7/70916* (2013.01)

(58) Field of Classification Search
CPC ............ G03F 7/70033; G03F 7/70741; G03F 7/70808; G03F 7/70708; G03F 7/70916; G03F 1/66; H01L 21/6833; H01L 21/6831; H01L 21/683
See application file for complete search history.

(56) References Cited

U.S. PATENT DOCUMENTS

| | | | | |
|---|---|---|---|---|
| 9,711,386 B2 * | 7/2017 | Cox | ................... | H01L 21/6833 |
| 2008/0037196 A1 * | 2/2008 | Yonekura | ............ | H01L 21/6831 |
| | | | | 361/234 |
| 2009/0284894 A1 * | 11/2009 | Cooke | ................. | H01L 21/6875 |
| | | | | 438/700 |
| 2011/0102965 A1 * | 5/2011 | Fujisawa | ............ | H01L 21/6833 |
| | | | | 361/234 |
| 2014/0253887 A1 * | 9/2014 | Wu | .......................... | G03F 1/82 |
| | | | | 355/30 |
| 2014/0268074 A1 * | 9/2014 | Chien | ................. | G03F 7/70741 |
| | | | | 355/30 |

FOREIGN PATENT DOCUMENTS

| | | | | |
|---|---|---|---|---|
| EP | 1777589 B1 * | 5/2010 | ......... | G03F 7/70341 |
| JP | 2011040464 A * | 2/2011 | | |
| JP | 2011096844 A * | 5/2011 | | |

* cited by examiner

*Primary Examiner* — Scott Bauer
*Assistant Examiner* — Shahzeb K Ahmad
(74) *Attorney, Agent, or Firm* — Birch, Stewart, Kolasch & Birch, LLP (57) ABSTRACT

A method for preventing photomask contamination includes generating a first electric field from an electrostatic chuck to attract a charged particle onto the electrostatic chuck, controlling the first electric field to detach the charged particle from the electrostatic chuck, and generating a second electric field below the electrostatic chuck to attract the charged particle.

20 Claims, 7 Drawing Sheets

Fig. 14

SEMICONDUCTOR APPARATUS AND METHOD OF OPERATING THE SAME FOR PREVENTING PHOTOMASK PARTICULATE CONTAMINATION

BACKGROUND

As the trend in the semiconductor manufacturing industry continues to reduce the sizes of various semiconductor devices, optical lithography using conventional transmission photomasks would no longer suffice as a viable technique for printing advanced devices on semiconductor wafers. However, the still shorter wavelengths desired for printing even smaller device structures are readily absorbed in transmission materials. An alternative technological means, i.e., the extreme ultraviolet lithography (EUVL), is introduced to replace the conventional optical lithography. Further, the extreme ultraviolet lithography (EUVL) includes utilizing an all-reflective technology, in which a reflection-type photomask is applied to substitute for the conventional transmission photomask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "substantially" or "approximately" shall generally mean within 20 percent, within 10 percent, or within 5 percent of a given value or range. Numerical quantities given herein are approximate, meaning that the term "around," "about," "substantially" or "approximately" can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Regarding extreme ultraviolet lithography (EUVL), various pellicles cannot be utilized therein since materials of the pellicles are opaque to EUV radiation. More specifically, the various pellicles on photomasks may absorb extreme ultraviolet (EUV) radiation and unfavorably deteriorate quality of the EUVL. However, the various pellicles may protect photomask surface against influence of particles in the atmosphere around the photomask or other types of contaminations. Further, the various pellicles may also make particles thereon be out of focus on a target wafer to prevent pattern distortion on the target wafer. Although photomasks may be protected by pellicles while not in use, the pellicles are still detached from the photomasks during the EUVL, such that protection provided by the pellicles would disappear during the EUVL. Additionally, as a wavelength of radiation used in lithography process becomes smaller, a minimum size of particle that is likely to negatively affect the lithography process decreases as well. Therefore, during the EUVL, particulate contamination on the photomask may noticeably increase and influence accuracy of pattern reflected from the photomask onto the target wafer. In an effort to adequately address the above-mentioned issues, various semiconductor apparatuses and methods of operating the same for preventing photomask particulate contamination and facilitating the EUVL are presented in accordance with various embodiments of the present disclosure as follows.

Figure 1:
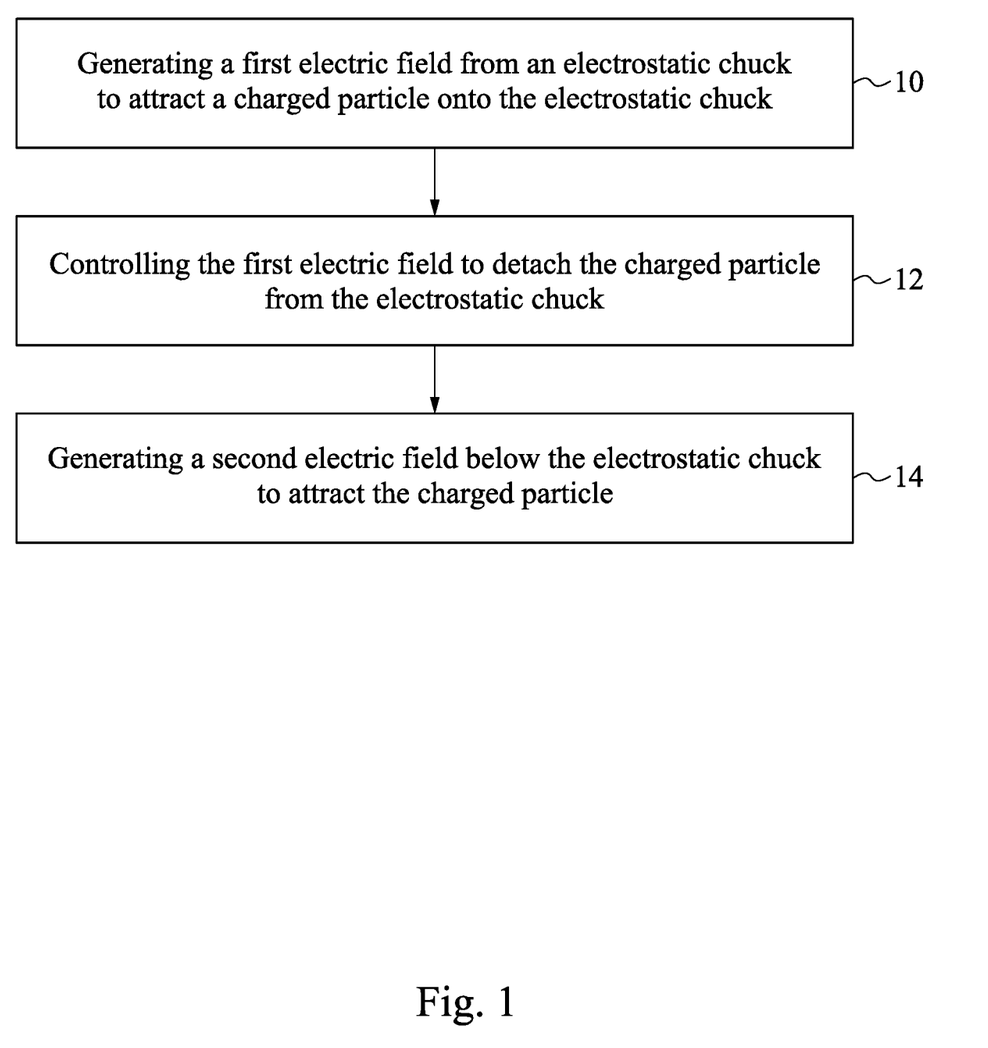
FIG. 1 is a flowchart illustrating a method of operating a semiconductor apparatus in accordance with some embodiments of the present disclosure.

FIG. 1 is a flowchart illustrating a method of operating a semiconductor apparatus in accordance with some embodiments of the present disclosure. The method begins with block 10 in which a first electric field is generated from an electrostatic chuck to attract a charged particle onto the electrostatic chuck. The method continues with block 12 in which the first electric field is controlled to detach the charged particle from the electrostatic chuck. The method continues with block 14 in which a second electric field below the electrostatic chuck is generated to attract the charged particle. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It is noted that each method presented in the present disclosure is merely an example and not intended to limit the present disclosure beyond what is explicitly recited in the claims. Additional operations may be provided before, during, and after each of the methods. Some operations described may be replaced, eliminated, or moved around for additional embodiments of the fabrication process. Additionally, for clarity and ease of explanation, some elements of the figures have been simplified.

Figure 2:
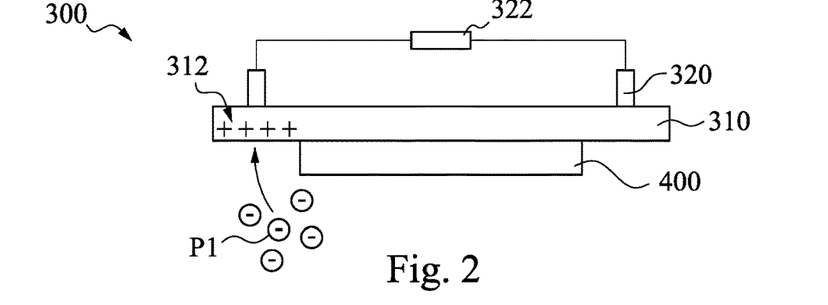
FIGS. 2-4 are schematic diagrams illustrating particle positions at various stages in accordance with some embodiments of the present disclosure.
Figure 3:
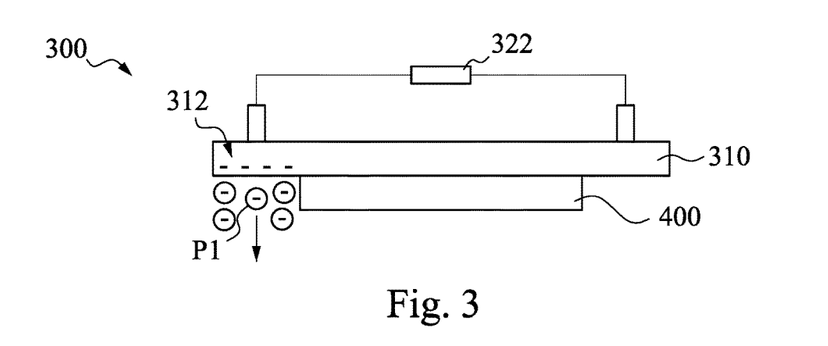
Figure 4:
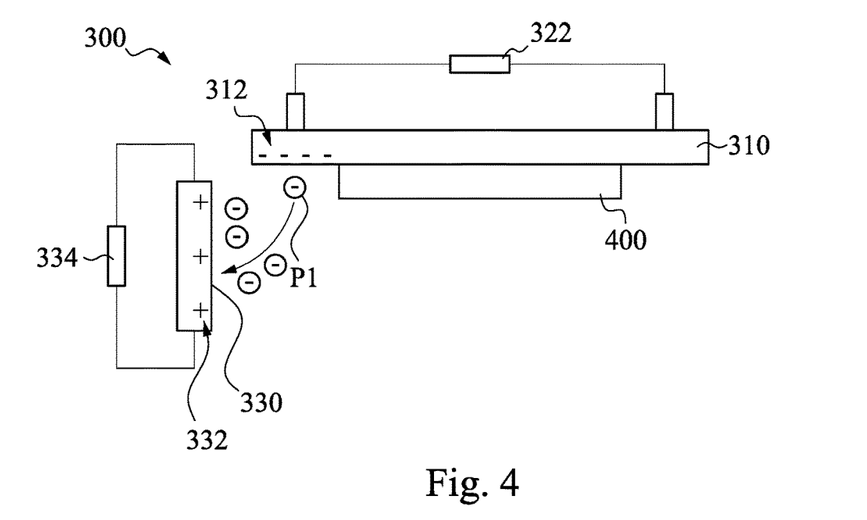

FIGS. 2-4 are schematic diagrams illustrating particle positions at various stages with respect to the method of FIG. 1 in accordance with some embodiments of the present disclosure. More specifically, the blocks 10-14 in FIG. 1 will be cited below in company with the schematic diagrams as illustrated in FIGS. 2-4 to collectively describe details of the method of FIG. 1.

Reference is made to FIG. 2. In some embodiments, a semiconductor apparatus 300 of the present disclosure is an electrostatic chuck apparatus. During an extreme ultraviolet lithography (EUVL), the electrostatic chuck apparatus 300 may hold a photomask 400 through attraction force therebetween. In some embodiments, the electrostatic chuck apparatus 300 may include an electrostatic chuck 310, a voltage clamp 320, and a power supply 322. In some embodiments, the electrostatic chuck 310 is a coulomb-force-type electrostatic chuck (ESC) that may realize stable attraction force generated between charges in the electrostatic chuck 310 and opposite charges induced around a surface of the photomask 400 that faces the electrostatic chuck 310. In some embodiments, the voltage clamp 320 is electrically coupled to the electrostatic chuck 310 and the power supply 322, such that the power supply 322 may apply a voltage to electrode(s) in the electrostatic chuck 310 through the voltage clamp 320 to generate said attraction force.

It is noted that the coulomb-force-type electrostatic chuck may have an insulating and dielectric surface layer that contacts a surface of an attracted object. The electrostatic chuck may utilize built-in electrodes to generate high potential static electricity, such that the surface of the attracted object could be polarized to facilitate formation of the attraction force. Additionally, even if the power for generating the static electricity is not applied to the electrodes of the electrostatic chuck, the residual charges of the electrostatic chuck and/or the attracted object may still remain to continue the attraction force. Under such a condition, if the attraction force is desired to be stopped, an opposite voltage could be applied to the electrodes of the electrostatic chuck, so as to eliminate the residual charges. Furthermore, while the electrostatic chuck holds the attracted object, a potential difference would not be generated on a backside of the attracted object (e.g., the bottom of the photomask 400), such that features (e.g., electronic circuit) on the backside of the attracted object may be protected.

The block 10 of FIG. 1 includes generating a first electric field 312 from the electrostatic chuck 310 to attract a charged particle P1 onto the electrostatic chuck 310. In some embodiments, the power supply 322 may apply a voltage to an electrode in a peripheral area of the electrostatic chuck 310. It is noted that the peripheral area includes portions of the electrostatic chuck 310 that are not covered by the photomask 400. Subsequently, the first electric field 312 may be generated in the peripheral area of the electrostatic chuck 310 through the applied voltage. In some embodiments, when the applied voltage is electrically positive and the charged particle P1 is electrically negative, the charged particle P1 would be attracted onto the electrostatic chuck 310 through the first electric field 312. In alternative embodiments, when the applied voltage is electrically negative and the charged particle P1 is electrically positive, the charged particle P1 would be attracted onto the electrostatic chuck 310 through the first electric field 312.

Reference is made to FIG. 3. The block 12 of FIG. 1 includes controlling the first electric field 312 to detach the charged particle P1 from the electrostatic chuck 310. In some embodiments, after the charged particle P1 moves onto the electrostatic chuck 310, the power supply 322 may switch a sign of the voltage applied to the electrostatic chuck 310. For example, when the applied voltage described in the block 10 is electrically positive, the applied voltage may be changed to be electrically negative. As a result, the first electric field 312 and the charged particle P1 may have the same electrical property. Therefore, as shown in FIG. 3, the charged particle P1 would be detached from the electrostatic chuck 310 through a repulsion force therebetween and further move away from the electrostatic chuck 310.

Reference is made to FIG. 4. The block 14 of FIG. 1 includes generating a second electric field 332 below the electrostatic chuck 310 to attract the charged particle P1. In some embodiments, the electrostatic chuck apparatus 300 may further include a collecting plate 330 and a power supply 334. In some embodiments, the collecting plate 330 is electrically coupled to the power supply 334, such that the power supply 334 may apply a voltage to electrode(s) in the collecting plate 330, so as to generate the second electric field 332 from the collecting plate 330. Further, the collecting plate 330 may be positioned to be adjacent to the electrostatic chuck 310. In some embodiments, the collecting plate 330 is below the electrostatic chuck 310 and also adjacent to the peripheral area of the electrostatic chuck 310 as shown in FIG. 4.

Since the second electric field 332 generated from the collecting plate 330 occurs, the charged particle P1 detached from the electrostatic chuck 310 may be attracted to and collected by the collecting plate 330 through the second electric field 332. For example, when the voltage applied to the electrostatic chuck 310 is changed to be electrically negative, the voltage applied to the collecting plate 330 may be electrically positive. Subsequently, the second electric field 332 and the charged particle P1 may have opposite electrical properties. Therefore, as shown in FIG. 4, the charged particle P1 would be attracted to the collecting plate 330 through an attraction force therebetween and further attached onto the collecting plate 330.

Figure 5:
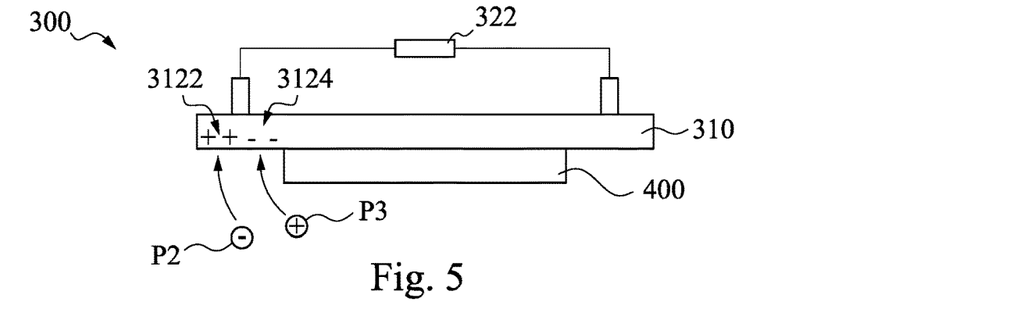
FIGS. 5-7 are schematic diagrams illustrating particle positions at various stages in accordance with some other embodiments of the present disclosure.
Figure 6:
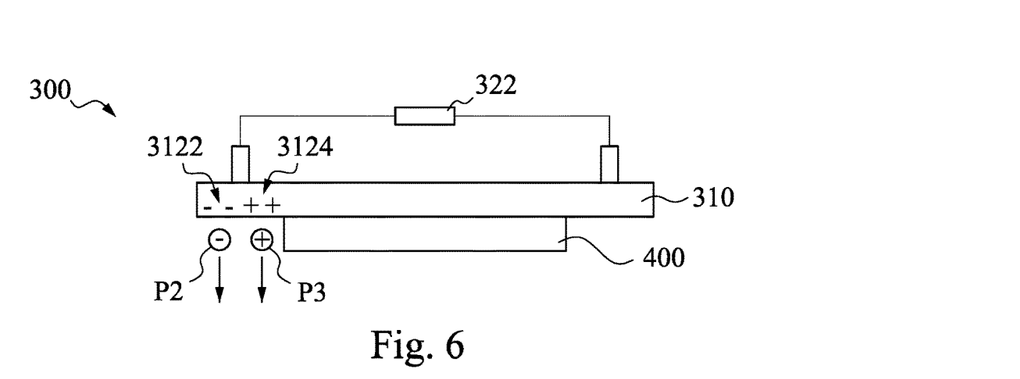
Figure 7:
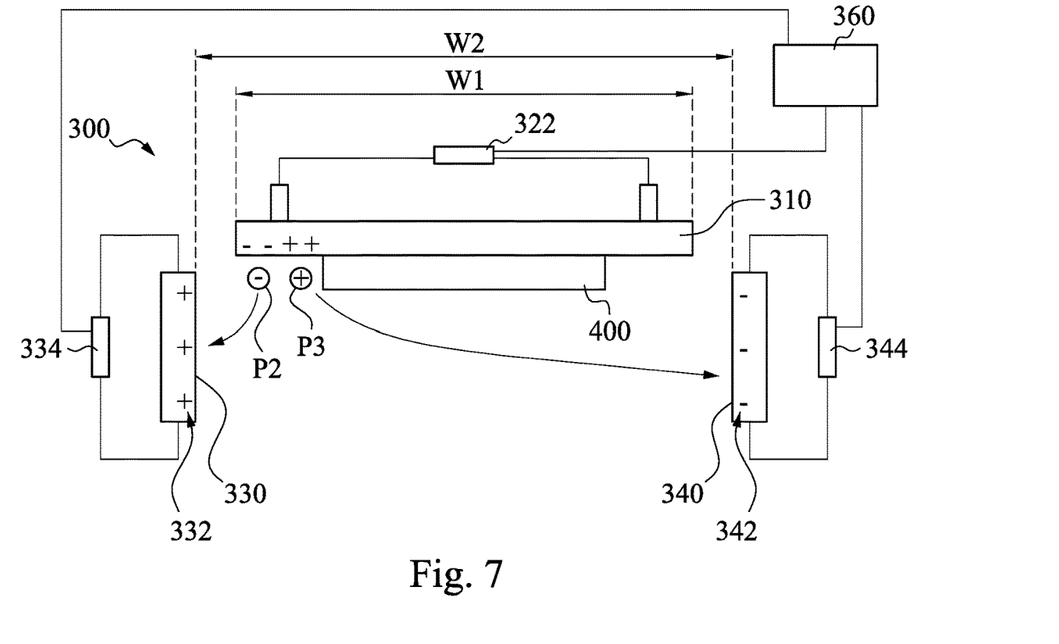

FIGS. 5-7 are schematic diagrams illustrating particle positions at various stages with respect to the method of FIG. 1 in accordance with some other embodiments of the present disclosure. More specifically, the blocks 10-14 in FIG. 1 will be cited below in company with the schematic diagrams as illustrated in FIGS. 5-7 to collectively describe details of the method. Since some components of FIGS. 2-4 are similar to those corresponding components of FIGS. 5-7, descriptions for those similar components will not be repeated hereinafter.

Reference is made to FIG. 5. Similarly, during an extreme ultraviolet lithography (EUVL), the photomask 400 is attached onto the electrostatic chuck 310 through attraction force therebetween. In some embodiments, a plurality of electrodes may be arranged in the electrostatic chuck 310 and connected to the power supply 322 respectively. Therefore, the power supply 322 may apply various voltages (e.g., different signs and/or magnitudes of voltages) to the electrodes in the electrostatic chuck 310 respectively, such that each electrode may generate a related electric field. For example, as shown in FIG. 5, when the power supply 322 applies voltages with different signs to the electrodes in the peripheral area of the electrostatic chuck 310, various electric fields (e.g., the electric field 3122 and the electric field 3124) may be accordingly generated.

Regarding the block 10 of FIG. 1, the electric field 3122 and the electric field 3124 are respectively generated from the peripheral area of the electrostatic chuck 310, such that particles (e.g., the charged particle P2 and the charged particle P3) with various electrical properties may be respectively attracted onto different portions of the electrostatic chuck 310 through different electric fields. For example, as shown in FIG. 5, a voltage applied to an electrode is electrically positive while another voltage applied to another electrode is electrically negative. Subsequently, when the charged particle P2 and the charged particle P3 are electrically negative and positive respectively, the charged particle P2 and the charged particle P3 would be attracted to the electrostatic chuck 310 by the electric field 3122 and the electric field 3124 respectively. Therefore, the charged particle P2 would be attached onto an area on the electrostatic chuck 310 adjacent to the electrode generating the electric field 3122, and the charged particle P3 would be attached onto another area on the electrostatic chuck 310 adjacent to the electrode generating the electric field 3124. Accordingly, the charged particle P3 is between the photomask 400 and the charged particle P2 after the charged particles P2 and P2 are attached by the electrostatic chuck 310.

Reference is made to FIG. 6. Thereafter, regarding the block 12 of FIG. 1, through the power supply 322, signs of the electric field 3122 and the electric field 3124 may be switched respectively, and thus, both the charged particle P2 and the charged particle P3 would be detached from the electrostatic chuck 310 by repulsion force between the electrostatic chuck 310 and said particles. For example, after the charged particle P2 is attached onto the electrostatic chuck 310 through the electric field 3122, the sign of the electric field 3122 may be changed to be electrically negative. Subsequently, the electric field 3122 and the charged particle P2 may have the same electrical property, such that the charged particle P2 would be repulsed by the electric field 3122 and move away from the electrostatic chuck 310.

Additionally, since some mechanisms between the charged particle P3 and the electric field 3124 are substantially similar to that between the charged particle P2 and the electric field 3122, descriptions for said similar mechanism may refer to the above-mentioned discussions about the charged particle P2 and the electric field 3122 to make the present disclosure more understood. Briefly, changing the sign of the electric field 3124 may generate repulsion force between the charged particle P3 and the electrostatic chuck 310, and thus, the charged particle P3 would be released from the electrostatic chuck 310 accordingly.

Reference is made to FIG. 7. In comparison with the apparatus as shown in FIG. 6, the electrostatic chuck apparatus 300 includes the collecting plate 330 and the power supply 334 of FIG. 4, and further includes a collecting plate 340 and a power supply 344. The power supply 344 is electrically coupled to the collecting plate 340, such that the power supply 344 may apply a voltage to electrode(s) in the collecting plate 340, so as to generate the electric field 342 from the collecting plate 340.

Additionally, the collecting plate 330 and the collecting plate 340 may be respectively positioned to be adjacent to the electrostatic chuck 310. In some embodiments, the collecting plate 340 is below the electrostatic chuck 310 and also adjacent to the peripheral area of the electrostatic chuck 310. In some embodiments, the collecting plate 330 is spaced apart from the collecting plate 340. For example, the collecting plate 330 is opposite to the collecting plate 340. Moreover, a surface of the collecting plate 330 capable of collecting charged particles and a surface of the collecting plate 340 capable of collecting charged particles may face each other. Therefore, after the power supply 334 and the power supply 344 apply voltages to the collecting plate 330 and the collecting plate 340 respectively, the electric field 332 and the electric field 342 may be separately provided around the electrostatic chuck 310, so as to improve attraction for the detached particles P2 and P3 with different electrical properties.

In some embodiments, the sign of voltage applied to the collecting plate 330 may be electrically opposite to the sign of voltage applied to the collecting plate 340. In other words, the polarity of the collecting plate 330 may be opposite to that of the collecting plate 340. Therefore, particles (e.g., the charged particle P2 and the charged particle P3) with different electrical properties may be respectively attracted onto different collecting plates 330 and 340 through different electric fields. For example, as shown in FIG. 7, after the charged particle P2 is released from the electrostatic chuck 310, since the charged particle P2 and the electric field 332 have opposite electrical properties, the charged particle P2 may be moved toward and collected by the collecting plate 330. Moreover, since the charged particle P3 and the electric field 342 have opposite electrical properties, the charged particle P3 may be moved toward and subsequently collected by the collecting plate 340. It is noted that the electric field 332 and the electric field 342 may also have the same electrical property based on various designs.

In some embodiments, as shown in FIG. 7, a distance W2 between the collecting plate 330 and the collecting plate 340 is greater than a width W1 of the electrostatic chuck 310. Due to the above-mentioned configuration, both the electrostatic chuck 310 and the photomask 400 may be positioned between the collecting plate 330 and the collecting plate 340. Therefore, charged particles around the electrostatic chuck 310 and the photomask 400 would be in the influence coverage of the collecting plate 330 and the collecting plate 340.

Figure 8:
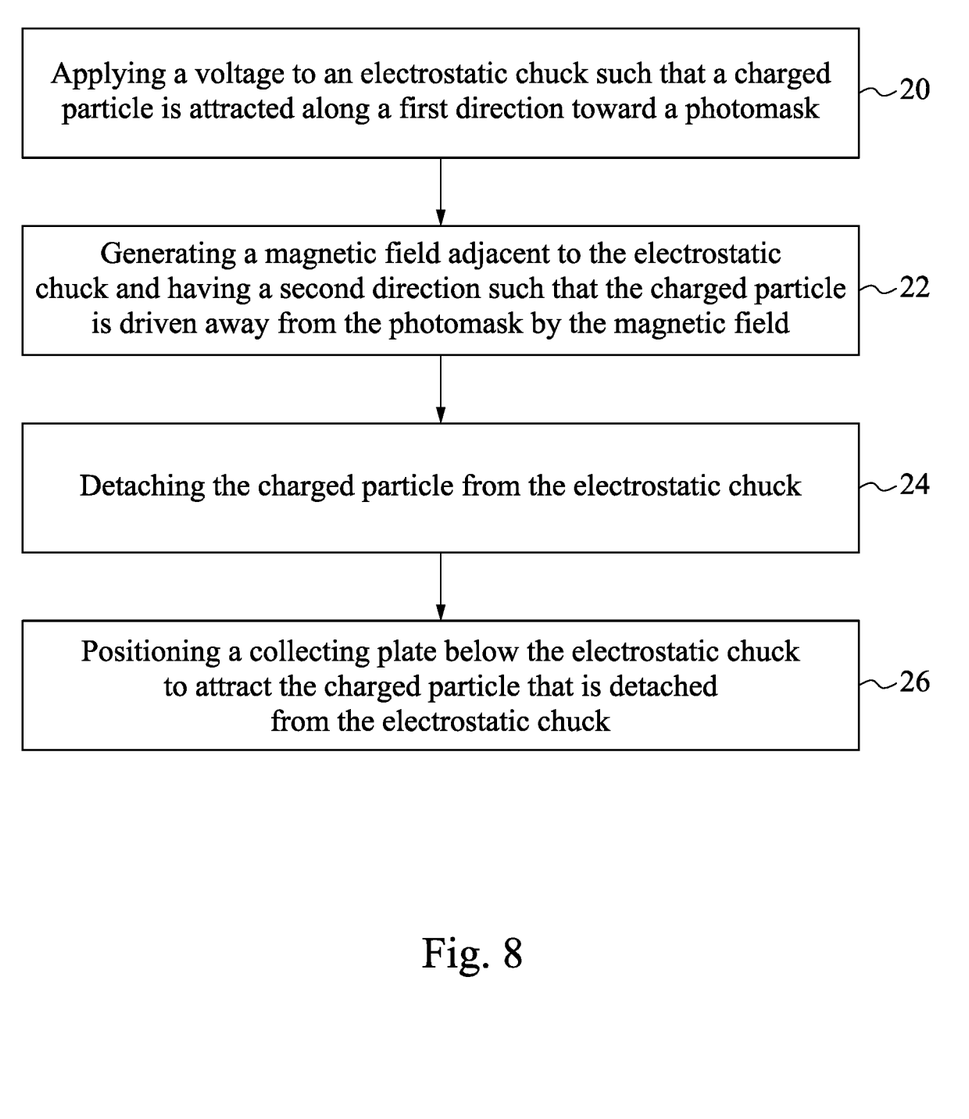
FIG. 8 is a flowchart illustrating a method of operating a semiconductor apparatus in accordance with some other embodiments of the present disclosure.

FIG. 8 is a flowchart illustrating a method of operating a semiconductor apparatus in accordance with some other embodiments of the present disclosure. The method begins with block 20 in which a voltage is applied to an electrostatic chuck such that a charged particle is attracted along a first direction toward a photomask. The method continues with block 22 in which a magnetic field is generated to be adjacent to the electrostatic chuck and have a second direction such that the charged particle is driven away from the photomask by the magnetic field. The method continues with block 24 in which the charged particle is detached from the electrostatic chuck. The method continues with block 26 in which a collecting plate is positioned below the electrostatic chuck to attract the charged particle that is detached from the electrostatic chuck. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIGS. 9, 10, 12, and 13 are schematic diagrams illustrating particle positions at various stages with respect to the method of FIG. 8 in accordance with some embodiments of the present disclosure. More specifically, the blocks 20-26 in FIG. 8 will be cited below in company with the schematic diagrams as illustrated in FIGS. 9-13 to collectively describe details of the method of FIG. 8.

Figure 9:
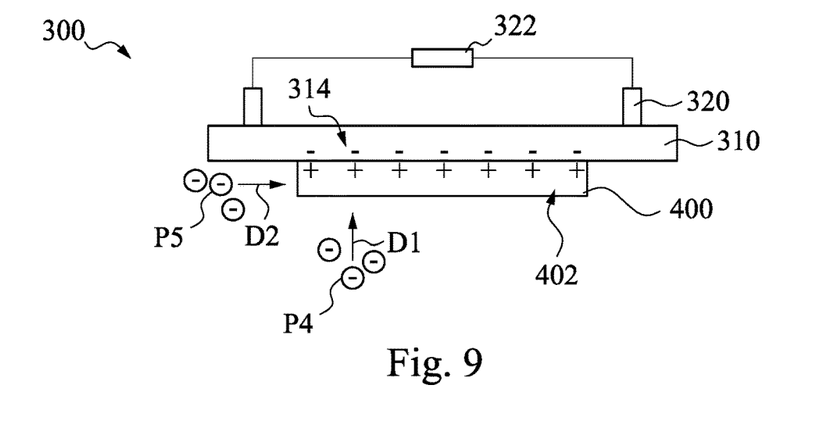
FIGS. 9 and 10 are schematic diagrams illustrating particle positions at various stages in accordance with some embodiments of the present disclosure.

Reference is made to FIG. 9. During an extreme ultraviolet lithography (EUVL), the photomask 400 is attached onto the electrostatic chuck 310 through attraction force therebetween. In some embodiments, at least one electrode is arranged in the central area of the electrostatic chuck 310 that may be covered by the photomask 400. The power supply 322 may be electrically coupled to the electrode. Therefore, the power supply 322 may apply a voltage to the electrode, such that the electrode may generate a related electric field.

The block 20 of FIG. 8 includes applying a voltage to the electrostatic chuck 310 such that a charged particle is attracted along a first direction (e.g., the direction D1 or the direction D2) toward the photomask 400. Through applying the voltage to the electrostatic chuck 310, the photomask 400 could be positioned on the electrostatic chuck 310. In some embodiments, when the power supply 322 applies a voltage with negative electrical property to the electrode in the central area of the electrostatic chuck 310, an electric field 314 may be accordingly generated from the central area of the electrostatic chuck 310. An electric field 402 from the top portion of the photomask 400 may be further induced by the electric field 314 and thus have positive electrical property. Since the electrostatic chuck 310 and the photomask 400 have opposite electrical properties, the photomask 400 may be firmly located on the bottom surface of the electrostatic chuck 310. However, the electric field 402 of the photomask 400 induced by the electric field 314 may unfavorably attract charged particle having electrical property opposite to that of the electric field 402 along the first direction (e.g., the direction D1 or the direction D2).

For example, when a charged particle P4 is electrically negative and located below the photomask 400, the charged particle P4 may be upwardly moved to the electrostatic chuck 310 through the electric field 402 with positive electrical property. In other words, the charged particle P4 may be moved in the vertical direction D1. For another example, when a charged particle P5 is electrically negative and located near a side of the photomask 400, the charged particle P5 may be horizontally moved to the electrostatic chuck 310 through the electric field 402 with positive electrical property. That is, the charged particle P5 may be moved in the horizontal direction D2.

Figure 10:
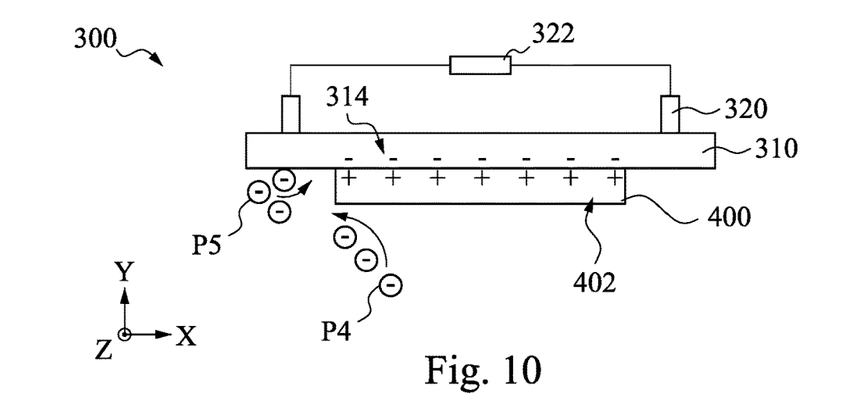

Reference is made to FIG. 10. When the charged particles P4 and P5 are moved toward the photomask 400, a magnetic field along the Z direction of FIG. 10 may be further provided to be around the photomask 400, so as to affect the moving directions of the charged particles P4 and P5 through Lorentz force. As a result, the charged particles P4 and P5 may be moved away from the photomask 400 due to the Lorentz force. More detailed descriptions about how the Lorentz force functions will be presented below based on FIG. 11 and the block 22 of the method of FIG. 8.

Figure 11:
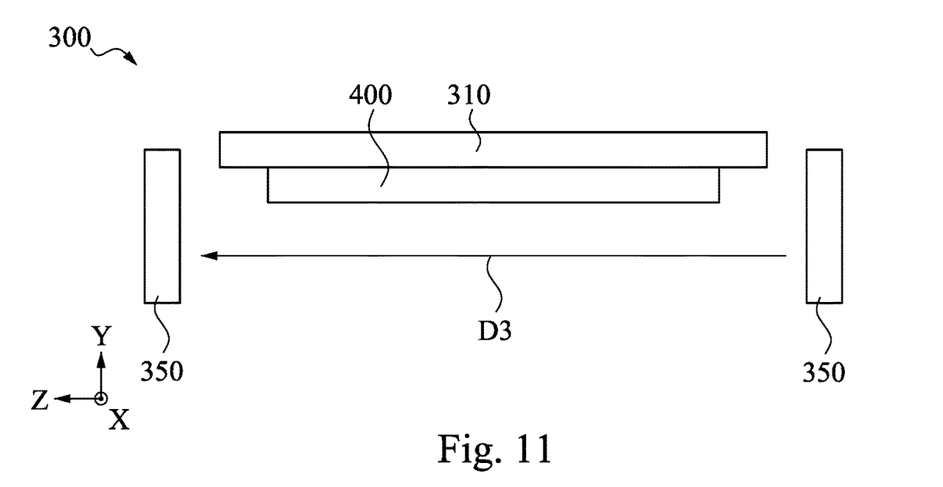
FIG. 11 is a schematic diagram illustrating a magnetic element in accordance with some embodiments of the present disclosure.

Reference is made to FIG. 11. FIG. 11 is a schematic diagram illustrating a magnetic element 350 in accordance with some embodiments of the present disclosure. In some embodiments, the electrostatic chuck apparatus 300 may further include the magnetic element 350. The magnetic element 350 is adjacent to the electrostatic chuck 310 and configured to generate the magnetic field. The magnetic field is a desired factor of the Lorentz force. In some embodiments, the magnetic element 350 is positioned at two opposite sides of the electrostatic chuck 310. In some embodiments, a top surface of the magnetic element 350 is substantially coplanar with or higher than a top surface of the photomask 400 (i.e., the bottom surface of the electrostatic chuck 310). As a result of such a configuration, the magnetic field may be provided below the electrostatic chuck 310 and pass through the photomask 400. For example, as shown in FIG. 11, the magnetic field from the magnetic element 350 may pass through the photomask 400 and the ambient space adjacent to the photomask 400 along a direction D3 (i.e., along the Z direction).

In some embodiments, the magnetic element 350 includes a permanent magnet that is an object made from magnetized material and creates its own persistent magnetic field. In some embodiments, the magnetic element 350 includes an electromagnet that is a type of magnet in which the magnetic field is produced and controlled by electric current.

As shown in FIGS. 10 and 11, the block 22 of FIG. 8 includes generating the magnetic field adjacent to the electrostatic chuck 310 and having a second direction (e.g., the direction D3) such that the charged particle is driven away from the photomask 400 by the magnetic field. More specifically, the above-mentioned Lorentz force (or electromagnetic force) is a combination of electric force and magnetic force exerted on a charged object due to electric field and magnetic field. A formula of the Lorentz force applied to the charged object may be denoted as F=qv×B, where F is the Lorentz force vector, q is the charge of the charged object, v is the velocity vector of the charged object, B is the magnetic field vector, and × is the vector cross product operation. In other words, the charged object that has the charge q and moves with the velocity v in the magnetic field B may experience the Lorentz force F. Due to the Lorentz force, the charged object may be driven along a direction of the vector cross product operation ×. It is noted that, in order to exert the Lorentz force on the charged particle, the moving direction of charged particle (i.e., said first direction) is desired to be different from the direction of magnetic field (i.e., said second direction).

For example, as shown in FIGS. 9-11, the charged particle P4 with negative electrical property is attracted toward the photomask 400 in the direction D1 (i.e., the Y direction), and the magnetic field is transmitted along the direction D3 (i.e., the Z direction). The direction D1 is substantially perpendicular to the direction D3. Based on the formula of the Lorentz force, the charged particle P4 would be subsequently driven left to be away from the photomask 400. For another example, as shown in FIGS. 9-11, when the magnetic field is transmitted in the direction D3, the charged particle P5 moving along the direction D2 (i.e., the X direction) would be driven upward to the bottom of the electrostatic chuck 310, such that the charged particle P5 would not reach and/or affect the photomask 400.

Additionally, when plasma is provided in an extreme ultraviolet lithography (EUVL) system to generate EUV radiation, the plasma may charge a particle nearby. Since the EUV radiation is an impulse capable of exerting momentum on the charged particle, the charged particle may be subsequently carried by the EUV radiation toward the photomask 400. Under the circumstances, if a magnetic field is provided around the photomask 400 and has a direction different from a moving direction of the charged particle, the above-mentioned Lorentz force may subsequently drive the charged particle away from the photomask 400, so as to prevent possible particulate contamination from moving onto the photomask 400.

Figure 12:
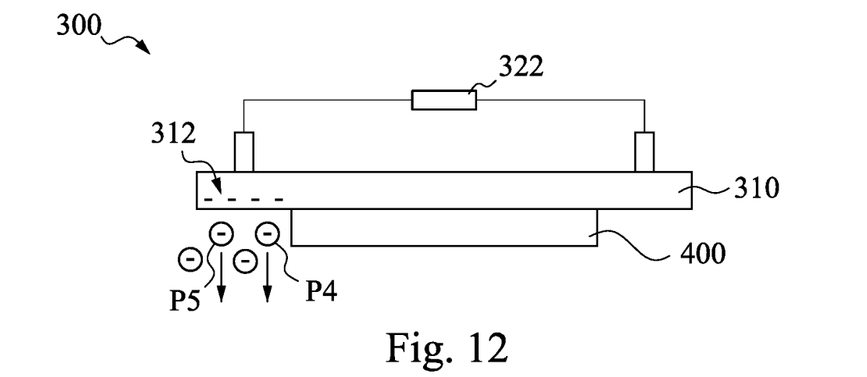
FIGS. 12 and 13 are schematic diagrams illustrating particle positions at various stages in accordance with some embodiments of the present disclosure.

Reference is made to FIG. 12. The block 24 of FIG. 8 includes detaching the charged particle from the electrostatic chuck 310. Since descriptions of FIG. 12 are substantially similar to that of FIG. 3, those similar descriptions may refer to the above-mentioned discussions to be more understood. Briefly, after the charged particle P4 and/or the charged particle P5 is driven and attached onto the peripheral area of the electrostatic chuck 310, the electric field 312 that has the same electrical property as the charged particle may be provided at the peripheral area of the electrostatic chuck 310, such that the charged particle would be subsequently released from the electrostatic chuck 310.

In alternative embodiments, when the magnetic field of FIG. 10 is formed, the power supply 322 may also apply a voltage that has opposite electrical property to the charged particle into electrodes at the peripheral area of the electrostatic chuck 310, such that the electric field 312 may be provided to help attract the charged particle. Subsequently, the power supply 322 may switch the sign of the voltage to repulse the charged particle from the electrostatic chuck 310. In some embodiments, after the charged particle is attracted onto the peripheral area of the electrostatic chuck 310, the power supply 322 may start to apply a voltage that has the same electrical property as the charged particle into electrodes at the peripheral area of the electrostatic chuck 310, such that the charged particle may be subsequently repulsed.

Figure 13:
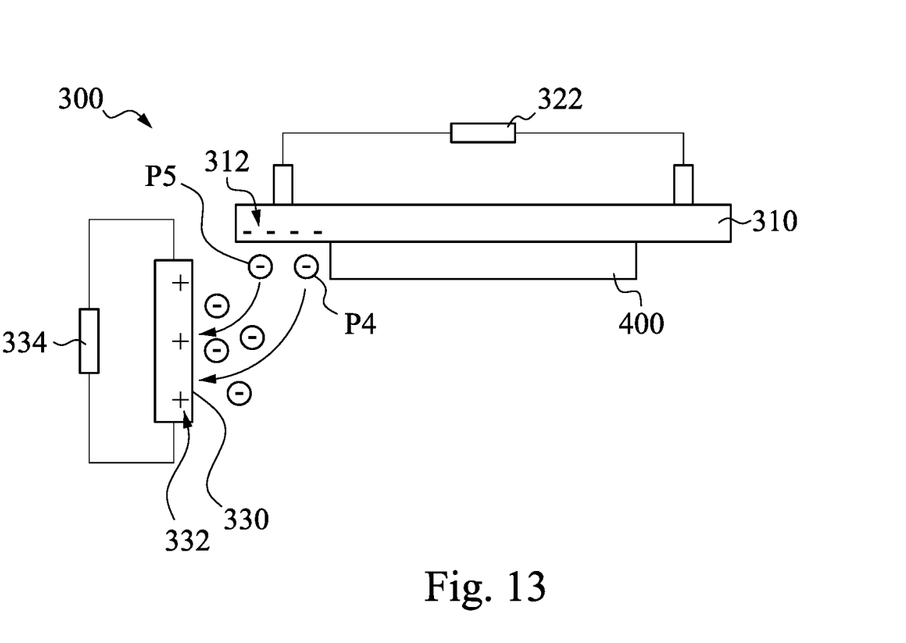

Thereafter, reference is made to FIG. 13. The block 26 of FIG. 8 includes positioning the collecting plate 330 below the electrostatic chuck 310 to attract the charged particle that is detached from the electrostatic chuck 310. Since descriptions of FIG. 13 are substantially similar to that of FIG. 4, those similar descriptions may refer to the above-mentioned discussions to be more understood. Briefly, since the electric field 332 generated from the collecting plate 330 occurs, the charged particles P4 and P5 detached from the electrostatic chuck 310 as described in the block 24 may be attracted to and collected by the collecting plate 330 through the second electric field 332.

In alternative embodiments, if the electrostatic chuck apparatus 300 of FIG. 13 further includes the collecting plate 340 of FIG. 7, both the collecting plate 330 and the collecting plate 340 may be positioned to improve attraction to the detached charged particle described in the block 24. In alternative embodiments, during operation of the block 22 of FIG. 8, the collecting plate 330 and/or the collecting plate 340 may be positioned to attract and collect the charged particle that is driven away from the photomask 400 by the Lorentz force before the charged particle is attached onto the electrostatic chuck 310.

It is noted that, although FIGS. 2-4, 5-7, 12, and 13 of the present disclosure illustrate electric field(s) provided at one side of the electrostatic chuck 310, configuration of electric field(s) from the electrostatic chuck 310 is not limited by the aforementioned embodiments. For example, additional electric field(s) may be simultaneously provided at another side of the electrostatic chuck 310 as well. For another example, electric field(s) may be provided at all of the peripheral area of the electrostatic chuck 310.

In some embodiments, the method of FIG. 1 may work in coordination with the method of FIG. 8. Under the circumstances, various charged particles may be driven away from the photomask 400 and subsequently collected by different collecting plates. Therefore, prevention of photomask particulate contamination could be improved. In some embodiments, after charged particle is collected by the above-mentioned collecting plate(s), the collecting plate(s) may be moved out to be further cleaned. Therefore, collected particle(s) will have no chance to affect and/or contaminate the electrostatic chuck 310 and photomask 400.

In some embodiments, the electrostatic chuck apparatus 300 includes a controller 360. More specifically, the controller 360 may be connected with the power supply 322, the power supply 334, and the power supply 344 of FIG. 7. Therefore, a polarity of the electrostatic chuck, a polarity of the collecting plate 330, and a polarity of the collecting plate 340 could be accordingly controlled to carry out various methods of the present disclosure.

Figure 14:
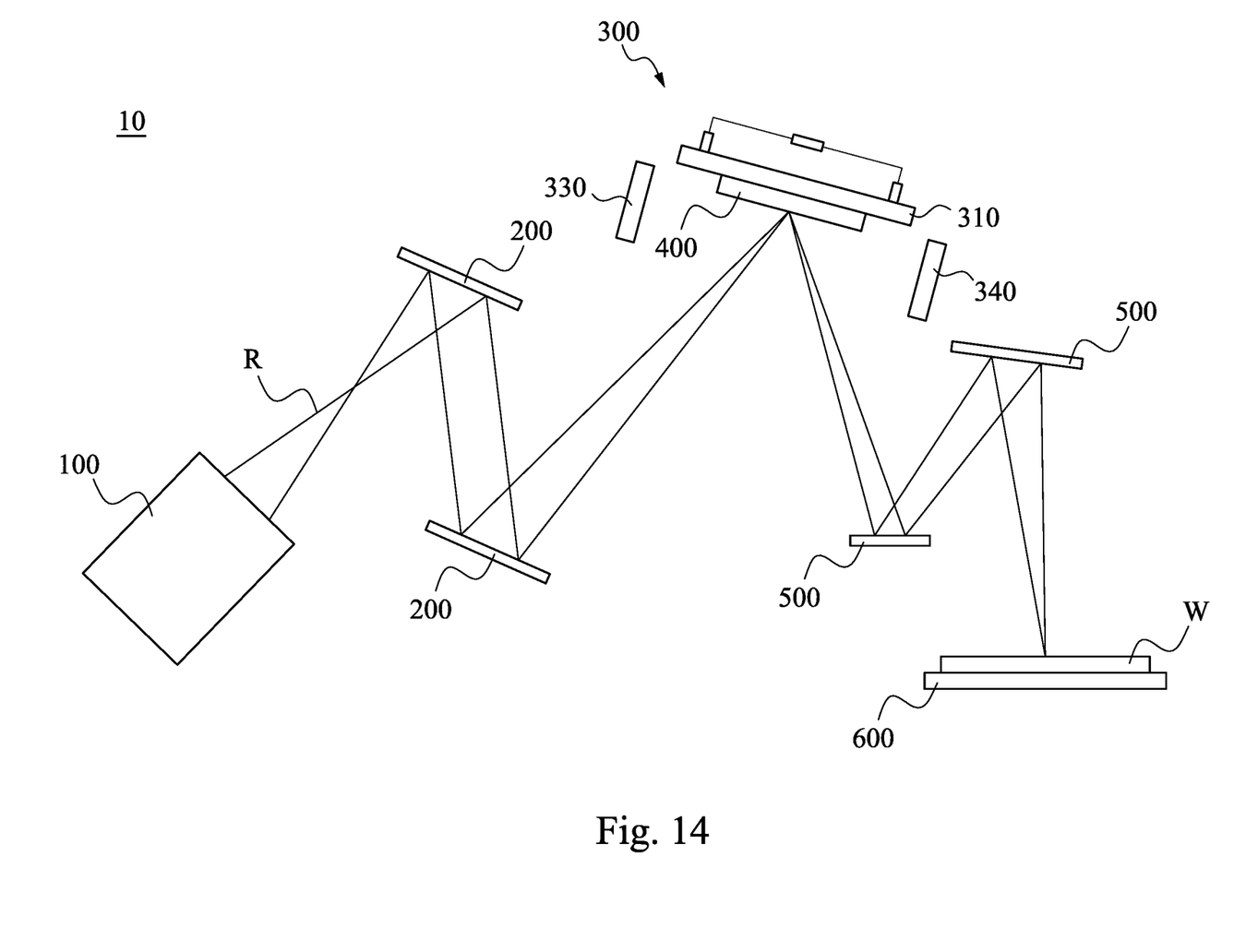
FIG. 14 is a schematic diagram illustrating an extreme ultraviolet lithography (EUVL) system in accordance with some embodiments of the present disclosure.

Reference is made to FIG. 14, which is a schematic diagram illustrating the extreme ultraviolet lithography (EUVL) system 10 in accordance with some embodiments of the present disclosure. In some embodiments, the EUV lithography system 10 may include a EUV light source module 100, an illuminator 200, the aforementioned electrostatic chuck apparatus 300, the photomask 400, a projection optics module 500, and a wafer stage 600. The EUV light source module 100 is configured to generate EUV radiation R. The illuminator 200 includes a variety of optic components, e.g., refractive optics having multiple lenses and reflective optics having multiple mirrors, to direct the EUV radiation R from the EUV light source module 100 toward the photomask 400. The photomask 400 with a circuitry pattern thereon is held by the electrostatic chuck apparatus 300. The EUV radiation R is then incident on and reflected by the photomask 400. Due to operation of the electrostatic chuck apparatus 300, charged particle(s) could be driven away from the photomask 400 and further collected, so as to prevent photomask particulate contamination. As a result, light intensity of the EUV radiation R can be maintained. The projection optics module 500 includes a variety of refractive optics and/or reflective optics to direct the EUV radiation R reflected by the photomask 400 toward a target wafer W positioned on the wafer stage 600. Therefore, through operation of the EUV lithography system 10, the EUV radiation R reflected by the photomask 400 may irradiate a photoresist layer on the target wafer W, such that said circuitry pattern on the photomask 400 would be duplicated onto the target wafer W.

Based on the above-mentioned descriptions, various advantages may be provided by the present disclosure. More specifically, since a photomask in EUVL system has no pellicle thereon, particle(s) around the photomask may result in photomask particulate contamination and thereby cause wafer yield loss. However, the present disclosure may control electric field(s) from the electrostatic chuck, such that the particle(s) would be attracted onto the electrostatic chuck and away from the photomask held by the electrostatic chuck. Additionally, the present disclosure may also utilize electric field in coordination with magnetic field, such that the particle(s) would be guided away from the photomask based on Lorentz force. Further, after the particle(s) is driven away from the photomask, additional electric field(s) may be provided beside the photomask and/or the electrostatic chuck, such that the particle(s) would be subsequently collected. Therefore, the particle(s) around the photomask may be efficiently removed and fall-on hit rate of the particle(s) on the photomask may be reduced, such that wafer yield will be improved.

In some embodiments, a method includes generating a first electric field from an electrostatic chuck to attract a charged particle onto the electrostatic chuck, controlling the first electric field to detach the charged particle from the electrostatic chuck, and generating a second electric field below the electrostatic chuck to attract the charged particle.

In some embodiments, a method includes applying a voltage to an electrostatic chuck such that a charged particle is attracted along a first direction toward a photomask, and generating a magnetic field adjacent to the electrostatic chuck and having a second direction such that the charged particle is driven away from the photomask by the magnetic field. The first direction is different from the second direction.

In some embodiments, a device includes an electrostatic chuck, a voltage clamp, and a first collecting plate. The electrostatic chuck is configured to hold a photomask. The voltage clamp is electrically coupled to the electrostatic chuck. The first collecting plate is adjacent to the electrostatic chuck and configured to collect a charged particle around the photomask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    securing a photomask on a bottom surface of an electrostatic chuck such that the photomask is in direct contact with a first portion of the bottom surface of the electrostatic chuck and is spaced apart from a second portion of the bottom surface of the electrostatic chuck;
    generating a first electric field on the second portion of the bottom surface of the electrostatic chuck from the electrostatic chuck to attract a charged particle onto the second portion of the bottom surface of the electrostatic chuck;
    controlling the first electric field to detach the charged particle from the electrostatic chuck; and
    generating a second electric field below the electrostatic chuck to attract the charged particle.

2. The method of claim 1, wherein generating the first electric field comprises:
    applying a voltage to the electrostatic chuck, wherein the voltage is either positive or negative.

3. The method of claim 2, wherein controlling the first electric field comprises:
    switching a sign of the voltage applied to the electrostatic chuck.

4. The method of claim 1, wherein generating the second electric field comprises:
    positioning a collecting plate to be adjacent to the electrostatic chuck; and
    applying a voltage to the collecting plate, wherein the voltage is either positive or negative.

5. The method of claim 1, further comprising:
    generating a third electric field that is adjacent to the electrostatic chuck and spaced apart from the second electric field.

6. The method of claim 5, wherein generating the third electric field comprises:
    positioning a first collecting plate and a second collecting plate to be adjacent to the electrostatic chuck, wherein the second collecting plate is opposite the first collecting plate; and
    applying a first voltage and a second voltage to the first collecting plate and the second collecting plate respectively.

7. The method of claim 6, wherein the first voltage is electrically opposite to the second voltage.

8. The method of claim 6, wherein a polarity of the first collecting plate is opposite to a polarity of the second collecting plate.

9. The method of claim 1, further comprising:
    generating a magnetic field below the electrostatic chuck.

10. The method of claim 9, wherein generating the magnetic field is such that the charged particle is away from the photomask.

11. A method, comprising:
    applying a voltage to an electrostatic chuck such that a charged particle is attracted along a first direction toward a photomask; and
    generating a magnetic field adjacent to the electrostatic chuck, below the photomask, and having a second direction such that the charged particle is driven away from the photomask by the magnetic field, wherein the first direction is different from the second direction, and generating the magnetic field comprises:
        positioning a pair of magnetic elements below the photomask and spaced apart from the photomask to generate the magnetic field, wherein the pair of magnetic elements are on opposite sides of the photomask.

12. The method of claim 11, wherein applying the voltage to the electrostatic chuck is such that the photomask is secured on the electrostatic chuck.

13. The method of claim 11, further comprising:
    detaching the charged particle from the electrostatic chuck.

14. The method of claim 13, wherein detaching the charged particle comprises:
    switching a sign of the voltage applied to the electrostatic chuck.

15. The method of claim 13, further comprising:
    positioning a collecting plate below the electrostatic chuck to attract the charged particle that is detached from the electrostatic chuck.

16. The method of claim 11, wherein generating the magnetic field further comprises positioning the pair of magnetic elements below and spaced apart from the electrostatic chuck.

17. An apparatus, comprising:
    an electrostatic chuck configured to hold a photomask, wherein the electrostatic chuck has a bottom surface, and when the electrostatic chuck holds the photomask, the bottom surface of the electrostatic chuck is in direct contact with the photomask;

a voltage clamp electrically coupled to the electrostatic chuck; and a first collecting plate adjacent to the electrostatic chuck and configured to collect a charged particle around the photomask, wherein a bottom surface of the first collecting plate is lower than the bottom surface of the electrostatic chuck.

18. The apparatus of claim 17, further comprising:
a magnetic element adjacent to the electrostatic chuck and configured to generate a magnetic field.

19. The apparatus of claim 17, further comprising:
a second collecting plate opposite to the first collecting plate, wherein a distance between the first collecting plate and the second collecting plate is greater than a width of the electrostatic chuck.

20. The apparatus of claim 17, further comprising:
a controller configured to control a polarity of the first collecting plate and a polarity of the electrostatic chuck.

* * * * *